United States Patent
Grundmann et al.

(10) Patent No.: US 11,433,610 B1
(45) Date of Patent: Sep. 6, 2022

(54) 3D PRINTING USING MICROLED ARRAY COUPLED WITH VOICE COIL

(71) Applicant: X Development LLC, Mountain View, CA (US)

(72) Inventors: Michael Jason Grundmann, San Jose, CA (US); Neil David Treat, San Jose, CA (US)

(73) Assignee: X Development LLC, Mountain View, CA (US)

( * ) Notice: Subject to any disclaimer, the term of this patent is extended or adjusted under 35 U.S.C. 154(b) by 845 days.

(21) Appl. No.: 16/279,864

(22) Filed: Feb. 19, 2019

(51) Int. Cl.
| | | |
|---|---|---|
| B33Y 50/02 | (2015.01) | |
| B29C 64/282 | (2017.01) | |
| B33Y 10/00 | (2015.01) | |
| B29C 64/393 | (2017.01) | |
| B29C 64/129 | (2017.01) | |
| B33Y 30/00 | (2015.01) | |

(52) U.S. Cl.
CPC .......... *B29C 64/282* (2017.08); *B29C 64/129* (2017.08); *B29C 64/393* (2017.08); *B33Y 10/00* (2014.12); *B33Y 30/00* (2014.12); *B33Y 50/02* (2014.12)

(58) Field of Classification Search
CPC ...................................................... B33Y 50/02
USPC ........................................................ 700/118
See application file for complete search history.

(56) References Cited

U.S. PATENT DOCUMENTS

| | | |
|---|---|---|
| 9,321,215 B2 | 4/2016 | Dudley |
| 9,937,665 B2 | 4/2018 | Dudley |
| 10,065,270 B2 | 9/2018 | Buller et al. |
| 2012/0161350 A1* | 6/2012 | Swanson ................ B33Y 30/00 264/40.7 |
| 2014/0271328 A1* | 9/2014 | Burris .................... B33Y 10/00 419/53 |

(Continued)

FOREIGN PATENT DOCUMENTS

| | | |
|---|---|---|
| CN | 107443731 | 12/2017 |
| WO | WO 2017192033 | 11/2017 |

OTHER PUBLICATIONS

'theorthocosmos.com' [online] "Laser SLA vs DLP vs Masked SLA 3D Printing Technology," Scott Frey, Mar. 23, 2017, [retrieved on Feb. 14, 2019] Retrieved from Internet: URL<https://theorthocosmos.com/laser-sla-vs-dlp-vs-masked-sla-3d-printing-technology-compared/> 15 pages.

(Continued)

*Primary Examiner* — Suresh Suryawanshi
(74) *Attorney, Agent, or Firm* — Fish & Richardson P.C.

(57) ABSTRACT

The disclosure provides an apparatus that includes: a stage defining a build plane; a micro light emitting diode (μLED) array including multiple pixels and configured to emit ultraviolet (UV) light towards the build plane; a two-dimensional (2-D) voice coil manipulator mechanically coupled to the μLED array and configured to align the pixels of the μLED array with the build plane; and a control module programmed to cause the μLED array to illuminate a UV curable material at the build plane to form a stack of layers of the three-dimensional object, wherein the apparatus adjusts a UV illumination pattern for the layers of the UV curable material by varying an output intensity of UV light from the pixels of the μLED array and by varying an alignment between the μLED array and the build plane using the 2-D voice coil manipulator.

20 Claims, 5 Drawing Sheets

(56) References Cited

U.S. PATENT DOCUMENTS

| | | | | |
|---|---|---|---|---|
| 2017/0028647 | A1* | 2/2017 | Chao | B29C 64/129 |
| 2018/0043619 | A1* | 2/2018 | Kim | B33Y 40/00 |
| 2018/0186082 | A1 | 7/2018 | Randhawa | |
| 2018/0215092 | A1 | 8/2018 | Dudley et al. | |
| 2019/0357751 | A1* | 11/2019 | Friedlander | A61B 1/00066 |
| 2020/0338826 | A1* | 10/2020 | Park | B33Y 30/00 |
| 2020/0361140 | A1* | 11/2020 | Chimmalgi | B29C 64/393 |

OTHER PUBLICATIONS

'www.dlinnovations.com' [online] "DLi Digital Light Innovations: 3DLP9000 UV Light Engine," Copyright 2014-2019 [retrieved on Feb. 14, 2019] Retrieved from Internet: URL<https://www.dlinnovations.com/dli/wp-content/uploads/3dlp900-uv-light-engine-spec-sheet.pdf> 2 pages.

'www.jasperdisplay.com' [online] "Pixel as a Platform for 'On Silicon' Partners," Available on or before Jan. 31, 2018, [retrieved on Feb. 14, 2019] Retrieved from Internet: URL<https://www.jasperdisplay.com/technology/> 4 pages.

Jiao et al. "Capability of GaN based micro-light emitting diodes operated at an injection level of kA/cm^2," Optics Express 23(13), Jun. 2015, 10 pages.

Lee et al. "Cure depth in photopolymerization: experiments and theory," Journal of Mater. Res., vol. 16(12), Dec. 2001, 9 pages.

Rottner et al. "New Field Effect Deep-UV μLEDs Development," Wiley Online Library, May 15, 2018, 5 pages.

* cited by examiner

3D PRINTING USING MICROLED ARRAY COUPLED WITH VOICE COIL

TECHNICAL FIELD

This disclosure generally relates to micro light-emitting diode devices (microLED or μLED) and methods of three-dimensional (3D) printing using microLED devices.

BACKGROUND

The present disclosure applies to 3D printing technologies. 3D printing or additive manufacturing is a process of making three-dimensional solid objects from a digital file. The creation of a 3D printed object is achieved using additive processes through which an object is created by laying down successive layers of material until the object is created. Each of these layers can be seen as a thinly sliced horizontal cross-section of the eventual object. 3D printing is the opposite of subtractive manufacturing which is cutting out/hollowing out a piece of metal or plastic with, for instance, a milling machine.

SUMMARY

The present disclosure describes techniques that can be used for scalable stereolithographic (SLA) 3D printing. These techniques incorporate the use of a UV microLED array in lieu of a projector or laser. A microLED may also be referred to as μLED interchangeably. The microLED array's pixels can have lateral dimensions under 10 μm with a pitch smaller than 20 μm. Such arrays can be assembled, or produced monolithically. In both cases, the array can be placed within a 2D voice coil manipulator to adjust the pixel's alignment with respect to a build plane. When the 2D position control is used in conjunction with a controlled light output pattern from the microLED array, the effective resolution and/or the build area can be improved. The microLEDs can have higher efficiency than conventional projector or laser. As such, the intensity of light at the build plane can be higher than for conventional sources, thereby allowing the use of low viscosity materials. This feature can increase the build rate and widen the material classes for use in SLA printing.

In one aspect, some implementations provide an apparatus for printing a three-dimensional object, the apparatus including: a stage defining a build plane; a micro light emitting diode (μLED or microLED) array comprising multiple pixels and configured to emit ultraviolet (UV) light towards the build plane; a two-dimensional (2D) voice coil manipulator mechanically coupled to the μLED array and configured to align the pixels of the μLED array with respect to the build plane; and an electronic control module in communication with the μLED array and the voice coil manipulator, the electronic control module being programmed to cause the μLED array to illuminate a UV curable material at the build plane to form a stack of layers of the three-dimensional object, wherein the apparatus adjusts a UV illumination pattern for the layers of the UV curable material by varying an output intensity of UV light from the pixels of the μLED array and by varying an alignment between the μLED array and the build plane using the two-dimensional voice coil manipulator.

Implementations may include one or more of the following features. Each pixel of the μLED array in a plane of the μLED array may have a maximum dimension of 10 μm or less. The pixels of the μLED array may be spaced in a plane of the μLED array with a pixel density of 100 pixels per inch (ppi) or more. Each pixel of the μLED array may include a field effect deep UV micro light emitting diode (μLED). Each field effect deep UV μLED may be characterized by a light conversion efficiency that is above 10%. The output intensity of the μLED array may be greater than 100 mW/cm$^2$.

The apparatus may further include one or more additional μLED array mechanically coupled to a voice coil manipulator assembly housing the μLED array and the voice coil manipulator, wherein the electronic controller is programmed to cause the two-dimensional voice coil manipulator to simultaneously align pixels of each μLED array with respect to the build plane. The micro light emitting diode (μLED) array may include a photomask arranged on a surface of the μLED array and configured to shape the output intensity from the μLED array. The photomask may be digitally displayed and configured to shape the output intensity from the μLED array such that when a particular pixel is deactivated, light emission is passed from the μLED array to a constituent layer of the UV curable material at the build plane. Each particular pixel may have a dimension that is fixed in a plane of the μLED array when the μLED array is manufactured. The pixels in a plane of the μLED array may be sized and shaped to be smaller than 10 μm in diameter and under 20 μm in pitch. The two-dimensional voice coil may include an active prismatic joint and a passive prismatic joint.

In another aspect, some implementations provide a method for printing a three-dimensional object, the method including: providing a ultraviolet (UV) curable material at a build plane; illuminating the UV curable material with a UV light pattern to form a sequence of layers of the three-dimensional object, the UV light being emitted by a micro light emitting diode (μLED) array with an output intensity greater than 100 mW/cm$^2$, the μLED array including multiple pixels; and aligning the pixels of the μLED array with respect to the build plane by using a two-dimensional voice coil manipulator mechanically coupled to the μLED array, wherein the UV illumination pattern at the build plane is varied for the layers by adjusting an output intensity of UV light from the pixels and by varying an alignment between the μLED array and the build plane.

Implementations may include one or more of the following features. Illuminating the UV curable material is preceding by one step of aligning the pixels of the μLED array such that the UV light pattern encompasses a specific layer of the UV curable material on the build plane. Illuminating the UV curable material may include operating the pixels of the μLED array with a light conversion efficiency above 10%. Illuminating the UV curable material may include operating one or more additional μLED array mechanically coupled to a voice coil manipulator assembly housing the μLED array and the voice coil manipulator. The method r may further include simultaneously aligning the pixels of each μLED array with respect to the build plane by using the two-dimensional voice coil manipulator mechanically coupled to each μLED array.

Aligning the pixels of the μLED array may include: operating the two-dimensional voice coil to distribute UV light emitted from the μLED array to achieve the optical illumination pattern on each constituent layer of the sequence of layers of the three-dimensional object. Operating the two-dimensional voice coil may include asserting a prismatic control to distribute UV light emitted from the μLED array. Operating the two-dimensional voice coil may include: asserting a revolute control to distribute UV light emitted from the μLED array.

The details of one or more implementations of the subject matter of this specification are set forth in the Detailed Description, the accompanying drawings, and the claims. Other features, aspects, and advantages of the subject matter will become apparent from the Detailed Description, the claims, and the accompanying drawings.

DESCRIPTION OF DRAWINGS

Like reference numbers and designations in the various drawings indicate like elements.

DETAILED DESCRIPTION

Figure 1:
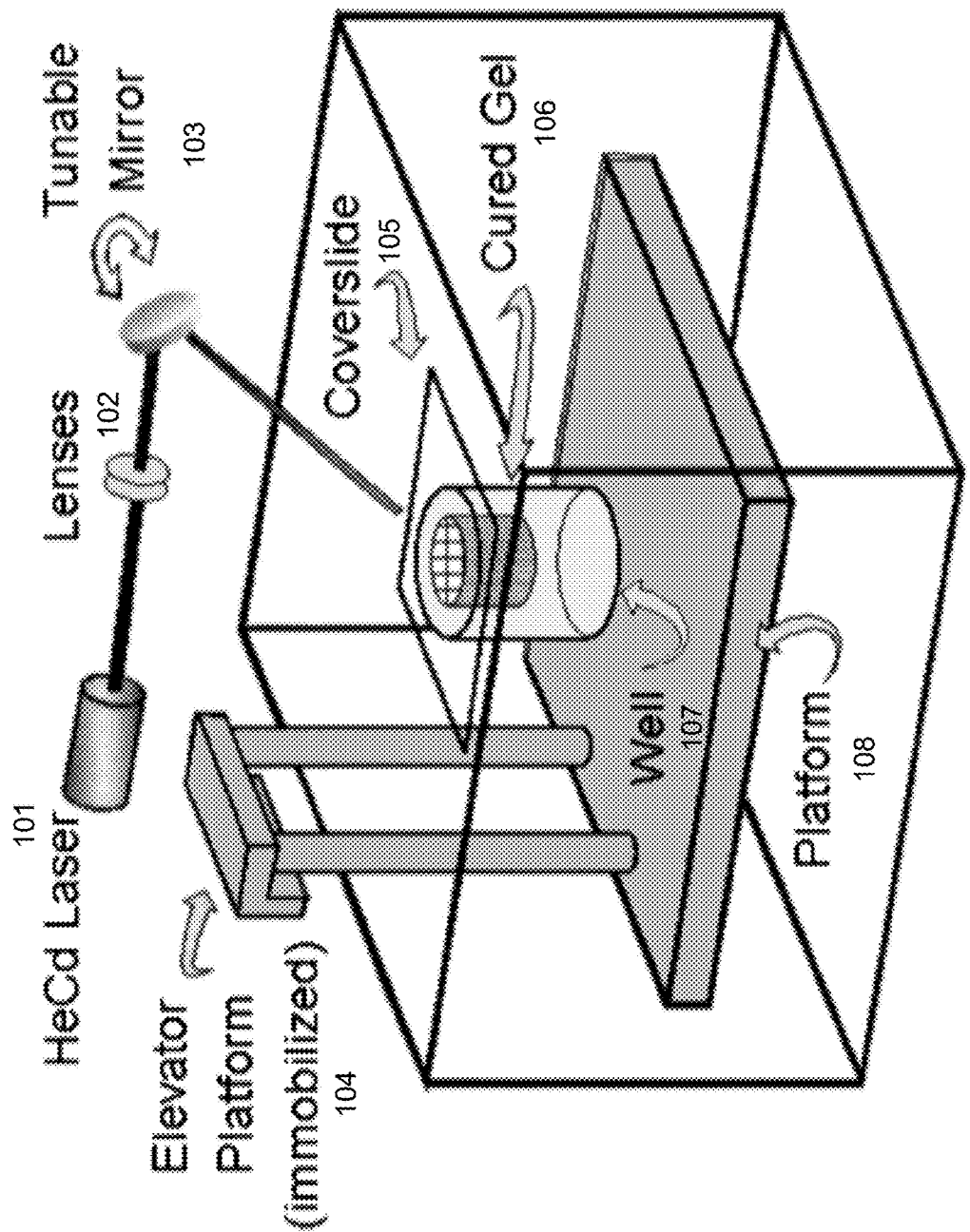
FIG. 1 shows an example of a stereolithography apparatus for 3D printing.

Some implementations incorporate the use of microLED arrays coupled with one or more voice coils. In these implementations, the resolution of the 3D printing system may be between 100 μm and 1 μm. This resolution metric is hundreds of times higher than conventional systems such as masked SLA (MSLA) and digital light processing (DLP)-based SLA systems. These implementations also provide scalability when multiple arrays are placed together to scale up the build platform. The build platform may also be known as the stage that defines the build plane. This consolidation is enabled by the use of voice coils. These implementations additionally provide speed of 3D printing in that higher light intensity resulting from the use of microLED arrays can lead to faster curing time and hence increased cure rate. In some implementations, the speed improvement can be 100 fold or more (e.g., 200 fold or more, 500 fold or more, such as around 690).

The word "stereolithography" comes from the Greek words "stereo," meaning solid, and "(photo)lithography," which is a form of 'writing' with light. Stereolithography apparatus (SLA) with a 3D printer does exactly that: drawing solids with light one layer at a time. In stereolithographic fabrication, a computer-aided design representation of a complex 3D object is computationally "sliced" into a sequence of 2D sections. An SLA system may fall in one of three main categories, namely, laser-based stereolithography apparatus (laser SLA), digital light processing stereolithography apparatus (DLP-SLA), and masked SLA (MSLA). For all these processes, a vat of photo-reactive liquid resin is selectively exposed to light in order to form very thin solid layers that stack up to create one solid object.

Laser-based SLA operates by using a UV laser to draw each layer of the object and uses two mirrors driven by a motor, known as galvanometers or 'galvos' (one on the X axis and one on the Y axis), to rapidly aim the laser beam across the print area, solidifying resin as the laser beam moves along. In order to create a solid object, the design can be broken down, layer by layer, into a series of points and lines that are given to the 'galvos' as a set of coordinates and the laser traces these coordinates out.

The DLP-SLA approach uses a digital projector to flash a single image of each layer across the entire platform at once. The platform may also be known as the stage that defines the build plane. Because the image of each layer is digitally displayed, such an image include numerous square pixels, resulting in a layer formed from small rectangular bricks called voxels that stack up along the Z axis.

The MSLA approach utilizes an LED array as the light source together with an LCD photomask to shape the light image from the LED array. Like DLP, the LCD photomask is digitally displayed and composed of square pixels. The pixel size varies based on how the LCD photomask is manufactured, and individual pixels are deactivated on the LCD to allow the LED light to pass through to form the resulting layer. Thus, the accuracy in the X-Y plane is fixed and does not depend on how well the lens is zoomed or scaled, as is the case with the DLP approach.

For these 3D printing processes, since each entire layer is exposed at once, rather than drawn out with a laser, both DLP-SLA and MSLA can achieve significantly faster print times than laser SLA. This increased speed is most noticeable with styles of 3D printing that allow for continuous light exposure, and when building certain kinds of objects. Hollowing out dental models with DLP-SLA and MSLA printers, saves material, but may not impact print times.

For large, fully dense prints, where the print will fill up most of the platform, each layer is exposed significantly faster with DLP-SLA or MSLA than it would be if drawn out by a laser. Also when printing very small and finely detailed objects, where it would take a laser a long time to move along all the coordinates, DLP-SLA and MSLA can also build at a faster rate.

Although DLP-SLA and MSLA can build significantly faster, both DLP-SLA and MSLA can introduce tradeoffs in resolution and surface finish with certain types of prints. DLP-SLA resolution depends on the quality of the projector, which defines how many pixels/voxels are available. For example, full HD is 1080p (pixels). The light source from the projector in must be focused to an image size in order to achieve a given X-Y resolution for each layer on the build platform. This can become a problem when printing numerous detailed objects together using small voxels. The projector only has a set number of pixels so in order to print the fine detail, the projected image may be shrunk down. This reduction can be managed with various means of optical correction, but as a general rule, finer details on a DLP-SLA printer are better achieved by using a fraction of the overall build area, and large prints can only build at the coarsest resolutions for the projector.

With the MSLA approach, the pixel size of the LCD photomask is set at manufacturing so that individual pixels can only be turned on or off to block the light from the LED array. The mask cannot be shrunk to attain finer detail and surface finish on small individual objects, and the light from the LED array cannot undergo any optical correction without a lens. The LCD units that mask the LED light are generally less expensive than DLP projectors, which can be advantageous.

In comparison, laser-SLA print can offer superior resolution and output quality and a wider range of materials. The general rule is that the longer the path for the laser to trace, the longer the print time; so hollowing out orthodontic models can reduce print times substantially. As opposed to DLP and MSLA, the print resolution of a laser SLA machine can be independent of the build volume. Indeed, a single print can be at a variety of sizes/resolutions and locations within the build area.

FIG. 1 shows an example of a stereolithography apparatus for 3D printing applicable to all three approaches. In this example, the stereolithography apparatus (SLA) rasters a laser beam across the surface of a liquid pool of photocurable resin. The laser beam polymerizes the surface of the resin, replicating the 2-D section. In more detail, HeCd (Helium Cadmium) laser 101 is used as a laser source. The HeCd laser operates as a gas laser, similar in operation to a helium neon laser. The lasing element, cadmium, is heated to convert it into the gas phase. Collisions with He atoms which have been excited by electrical discharge then excite the Cd atoms into the laser emitting excited state. The emitted laser light can be in the violet or ultraviolet wavelength range, for example, from 440 nm to 322 nm. HeCd laser 101 is coupled to lenses 102 for focusing or collimation purposes. Lenses 102 may include a set of lens. The exiting laser beam from lenses 102 is bounced by tunable mirror 103, which can pivot to steer the laser beam to reach a specific location, for example, in curing gel 106. As illustrated, curing gel 106 is secured in well 107 mounted on elevator platform 107. In one instance, 60/40 weight ratio bisphenylglycidyl dimethacrylate (BisGMA)/trichloroethylene solution is pipetted inside well 107, which is cylindrical. While the elevator platform 107 may be immobilized on platform 108, cover slide 105 is placed on top of well 107 to act as a substrate for gel attachment. In some cases, elevator platform 107 submerges the cured layer deeper into the resin pool, and the next layer is polymerized. By subsequently building each new layer above the preceding layer, the designed 3D object is replicated as a real solid structure. The depth that can be reached by the curing process determines the thickness of the sections that can be fabricated and therefore the number of layers to fabricate a 3D object. The scanning velocity, and hence, energy dosage, can be programmed via the stereolithography software.

Figure 2A:
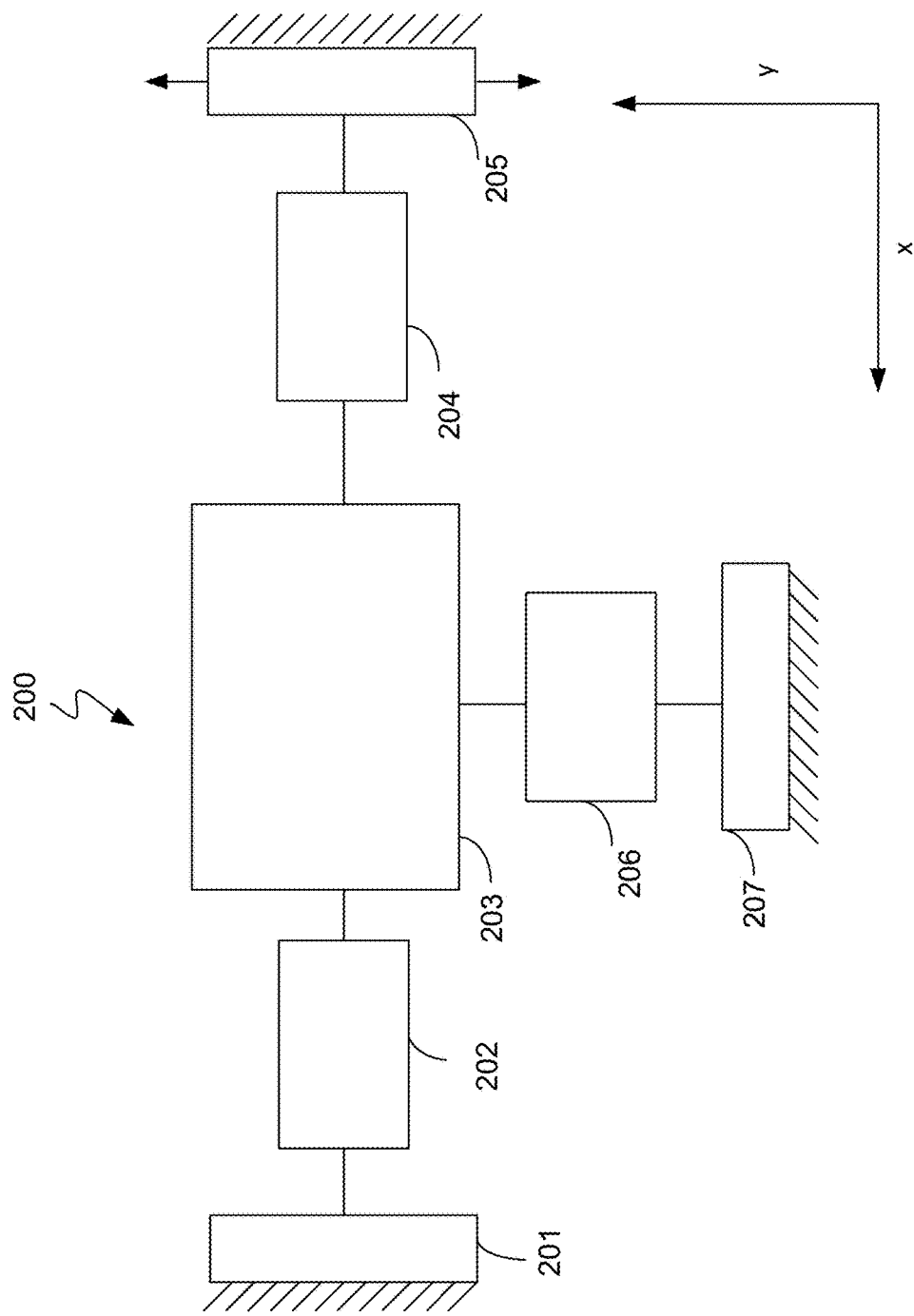
FIG. 2A shows a top view of an example of a 3D printing system according to some implementations of the present disclosure that use microLED arrays.

FIG. 2A shows the top view of an example of a 3D printing system 200 that use microLED arrays. Here, platform 203 is a mounting platform for placing, for example, curing material for additive printing. In the X-Y plane shown, passive prismatic joint 204 couples the platform 203 to active prismatic joint 205, which is maneuverable in the Y direction. In the same X-Y plane, passive prismatic joint 206 couples the platform 203 to active prismatic joint 207, which is maneuverable in the X direction. In the Z direction, which is through the X-Y plane, passive prismatic joint 202 couples the platform 203 to active prismatic joint 201. A prismatic joint provides a linear sliding movement between two bodies, for example, two posts along the Y direction. A prismatic joint is often called a slider, as in the slider-crank linkage. A prismatic pair is also called as sliding pair. In some case, a prismatic joint is formed with a polygonal cross-section to resist rotation. Here, a passive prismatic joint does not include a motorized unit that can initiate a linear motion. An active prismatic joint, on the other hand, typically incorporates a motor unit to drive the slide to achieve actuation.

Figure 2B:
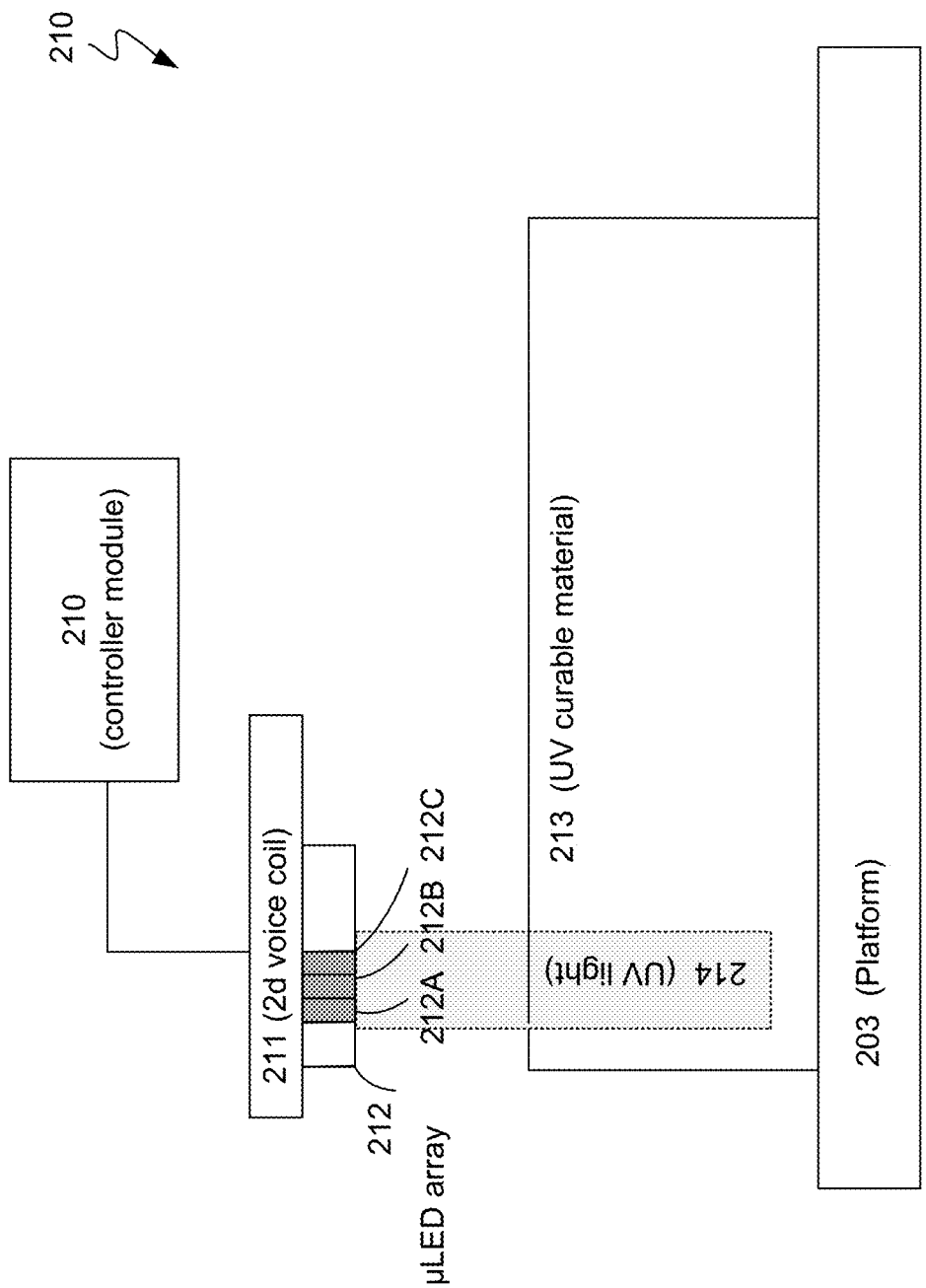
FIG. 2B shows a side view of the example of the 3D printing system according to some implementations of the present disclosure that use microLED arrays.

Further referring to FIG. 2B, a side view of the example of the 3D printing system is shown. A controller module 210 is coupled to a two-dimensional (2D) voice coil 211 to actuate the voice coil. As illustrated, a microLED array 212 is mounted on voice coil 211. As an array device, the microLED array includes multiple microLED elements, for example, microLED 212A to 212C. The controller module 210 may be further coupled to microLED array 212 to adjust light output and duty cycle. Light, often in the ultraviolet (UV) band, is emitted from the activated elements of the microLED array into the UV curable material 213 to cover an illumination area 214, where polymerization is occurring. UV curable material 213 is placed on platform 203.

Within illumination area 214, the rate of polymerization $R_p$ due to UV exposure can be expressed:

$$R_P = k_P[M]\left(\frac{R_i}{2k_1}\right)^{1/2}$$

where $k_p$ is the kinetic rate constant for propagation, [M] is monomer concentration, $R_i$ is the rate of radical initiation, and $K_t$ is the kinetic rate of termination. For bifunctional photoinhibitors, the initiation rate, $R_i$ is related to the photo influx, $I_z$, by:

$$R_i = 2\phi\epsilon[PI]I_z$$

where $\phi$ is the quantum yield of the photoinhibitor, $\epsilon$ is the molar extinction coefficient, [PI] is the molar concentration of photoinhibitor (M), and $I_z$ is the incident photonic flux, or intensity, at depth z.

Hence, the rate of polymerization is related to photonic flux. Assuming factors such as monomer concentration, quantum yield of photo inhibitor, and molar extinction coefficient are held as constants, the rate of polymerization is linearly proportionate to the square root of the photonic flux. In this context, microLED devices proffers unique advantages, as compared to SLA and DLP projectors. For comparison, SLA using UV lasers typically utilize 40 mW He—Cd laser with width of 125 µm. In a build volume of 320 mm by 320 mm, the light intensity would be around 0.039 mW/cm². For DLP projectors, the typical operating parameters are 3 W at 405 nm with a projection width of 320 mm and pixel size of 100 µm. For a build volume of 320 mm by 320 mm, the light intensity would be approximately 2.93 mW/cm². UV microLED, however, can typically operate at $1.2 \times 10^5$ mW/cm² with 90% external quantum efficiency (EQE), at 421 nm wavelength, and with a pixel diameter of 2 µm. For pixel density greater than 2000 ppi, which translates to 787.4 pixel per cm or $8 \times 10^5$ pixels in 320 mm×320 mm, light intensity would be 18750 mW/cm². Notably, the emergence of field Effect deep UV microLED may increase efficiency from 9.6% up to a predicted 60%. When the polymerization rate is proportional to the square root of light intensity, the ratio of polymerization for each layer relative to SLA:DLP:µLED is 1:8.7:692.8. Assuming each layer requires a 10 second cure time for traditional SLA and DLP, a part with 1000 layers would take 167 minutes and 19 minutes, respectively. Due to the much increased light intensity, the disclosed microLED approach would take a 12 seconds of illumination time. This is an improvement over 690 folds.

Moreover, microLEDs devices have witnessed a decrease of pixel size from about 12 µm in 2002 to about 3.74 µm in 2013. Hence, the resolution improvement from traditional SLA and DLP approaches would be over a factor of 100 times (for example, from about 100 µm to about 1 µm), thereby enabling ultra-smooth parts and possibility for miniature parts.

Additionally, the disclosed microLED approach proffers unprecedented scalability by placing multiple arrays together to make a scalable build platform enabled by the use of voice coils such as 2D voice coils 211. Voice coil actuators (VCAs) are direct drive, limited motion devices that utilize a permanent magnet field and coil winding (conductor) to produce a force that is proportional to the current applied to the coil. These non-commutated electromagnet devices are used in linear and rotary motion applications for linear force or torque output, and high acceleration, or high frequency oscillation. While such coils may have been used in radio loud speakers, voice coil actuators are more frequently used in applications for proportional or tight servo control. In 3D printing applications using multiple microLED arrays, each microLED array can be actuated by a voice coil to adjust the focal point of impact and printing trajectory. The voice coil can include an active prismatic joint and a passive prismatic joint. The parameters for controlling focal point of impact and printing trajectory can prescribed and then executed by control module 210.

Figure 3:
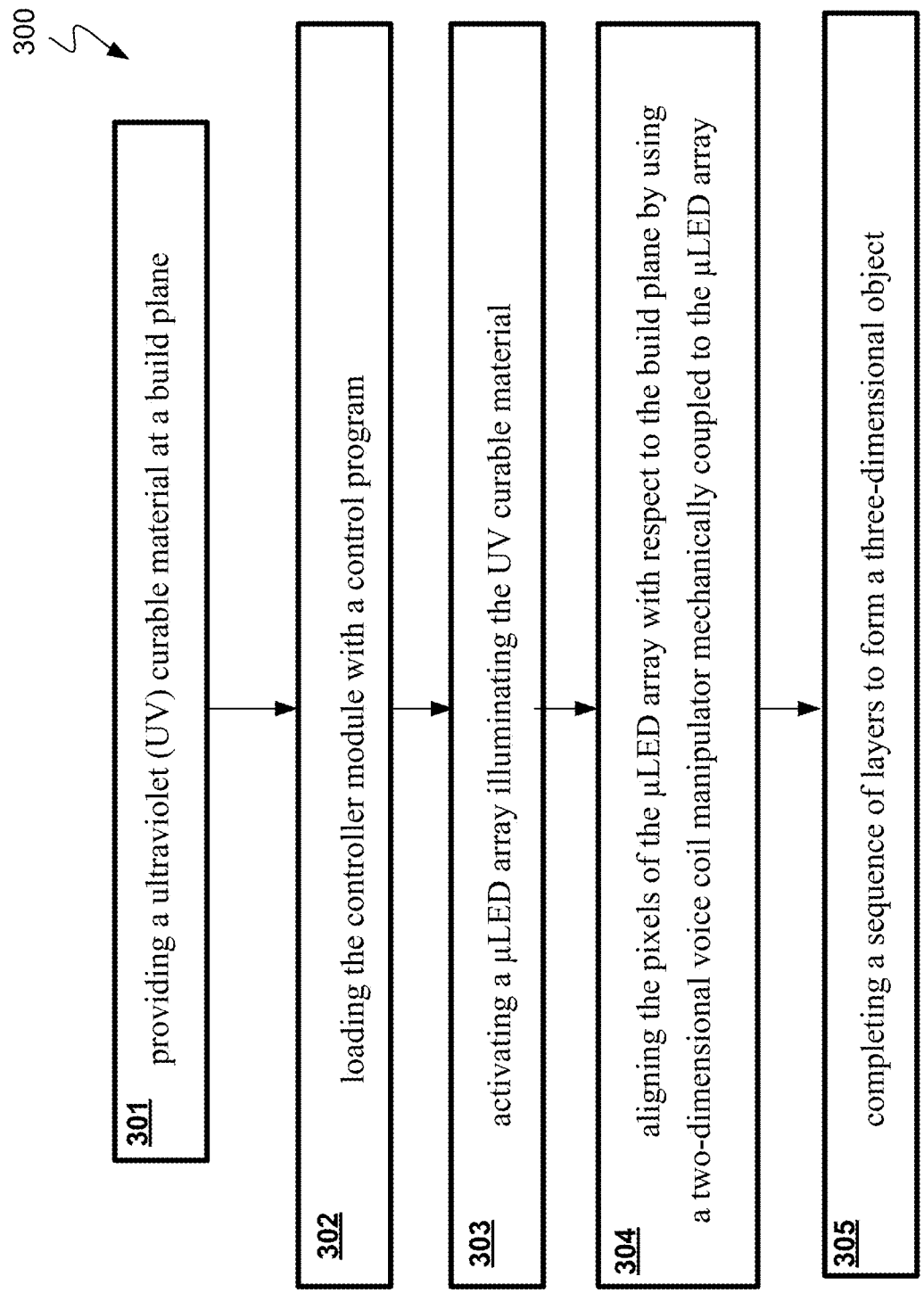
FIG. 3 is a block diagram illustrating an example computer system used to provide computational functionalities associated with described algorithms, methods, functions, processes, flows, and procedures according to some implementations of the present disclosure.

Further referring to FIG. 3, a flow chart illustrates an example method 300 for 3D printing using microLED arrays, according to some implementations of the present disclosure. For clarity of presentation, the description that follows generally describes method 300 in the context of the other figures in this description. However, it will be understood that method 300 can be performed, for example, by any suitable system, environment, software, and hardware, or a combination of systems, environments, software, and hardware, as appropriate. In some implementations, various steps of method 300 can be run in parallel, in combination, in loops, or in any order.

A UV curable material is provided at a build plane (301), for example, loaded on platform 203. Examples of UV curable materials include resins, photopolymers, and adhesives. Control module 210 is then loaded with a control program (302). In some instances, the control program can be a computer-executable program and includes the dimensional specification for the 3D structure to be printed. Additionally, the control program may include motion instructions for controlling the voice coil as well as exposure instructions for controlling the specific microLED devices. In these instances, the motion instructions include specific instructions defining the linear and rotational aspect of pivoting the voice coil. The exposure instructions include specific instructions prescribing driving current of the microLED devices, light intensity of each microLED, and duration of exposure.

The microLED array may then be activated according to the control program to illuminate the UV curable material mounted on platform 203 (303). The platform may also be known as a stage that defines a build plane. The illumination may involve a parallel process using multiple microLED arrays to simultaneously illuminate different parts of the UV curable material. Each of the microLED array devices can be individually controlled to specifically target the UV curable material for curing by light exposure from the microLED array. In more detail, each pixel of the microLED array may be aligned with respect to the build plane by using a specific two-dimensional (2D) voice coil manipulator mechanically coupled to the microLED array (304). Each pixel of the microLED array may have a maximum dimension of 10 μm or less. The pixels of the microLED array may be spaced in a plane with pixel density of more than 100 pixels per inch. Each pixel of the microLED array may include a field effect deep UV micro LED with a light conversion efficiency that is above 25%. The output intensity of the microLED array may be greater than 100 mW/cm$^2$. The microLED array may include a photomask arranged on the array surface to shape the output intensity from the microLED array. The photomask may be digitally displayed and operable to shape the output intensity from the μLED array such that when a particular pixel is deactivated, light emission is passed from the μLED array to a constituent layer of the UV curable material at the build plane. Each pixel has a dimension that is fixed in a plane of the microLED array during the array was manufactured. The pixels in a plane of the μLED array may be sized and shaped to be smaller than 10 μm in diameter and under 20 μm in pitch. The build process may proceed layer by layer until a sequence of layers are completed to form a three-dimensional object (305).

Figure 4:
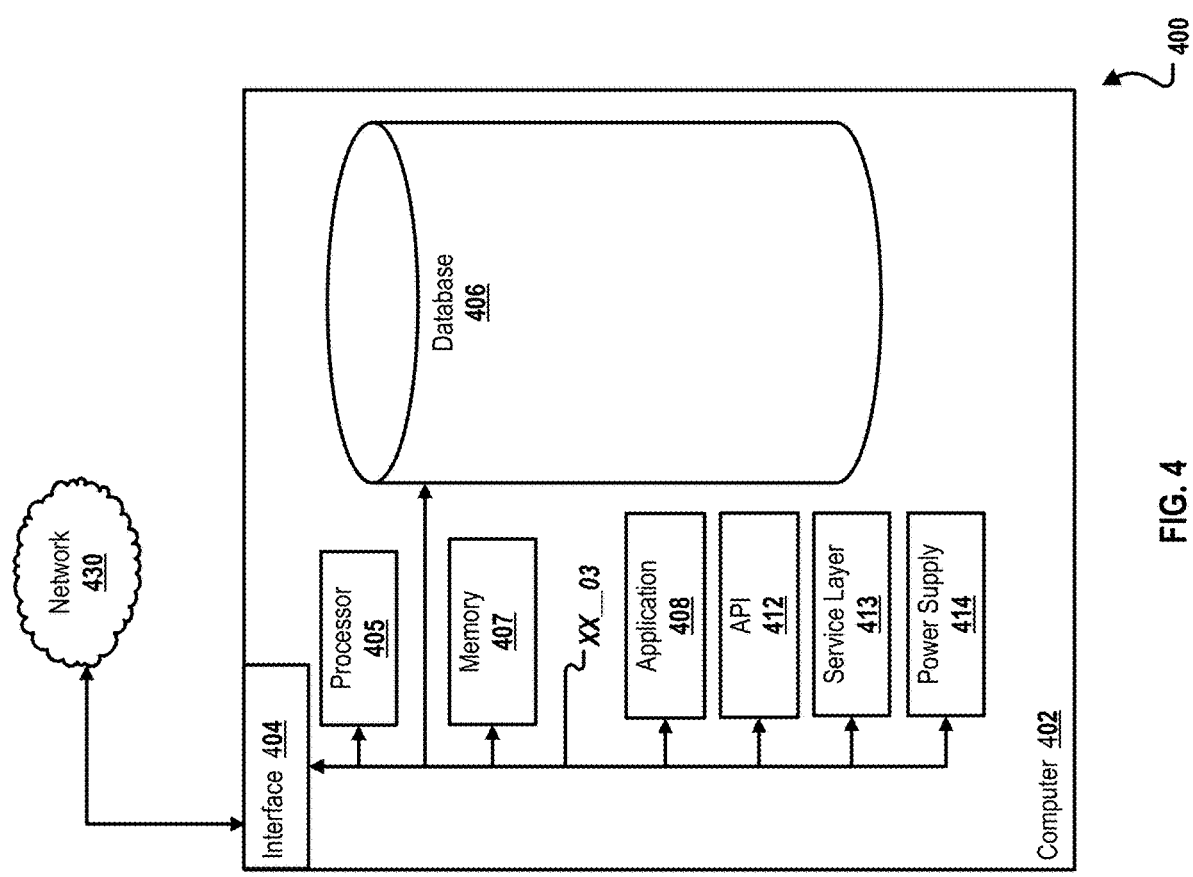
FIG. 4 shows an example of a 3D printing process according to some implementations of the present disclosure.

FIG. 4 is a block diagram illustrating an example computer system 400 used to provide computational functionalities associated with described algorithms, methods, functions, processes, flows, and procedures according to some implementations of the present disclosure. For example, control module 210 from FIG. 2B may incorporate computer system 400. The illustrated computer 402 is intended to encompass any computing device such as a server, a desktop computer, a laptop/notebook computer, a wireless data port, a smart phone, a personal data assistant (PDA), a tablet computing device, or one or more processors within these devices, including physical instances, virtual instances, or both. The computer 402 can include input devices such as keypads, keyboards, and touch screens that can accept user information. Also, the computer 402 can include output devices that can convey information associated with the operation of the computer 402. The information can include digital data, visual data, audio information, or a combination of information. The information can be presented in a graphical user interface (UI) (or GUI).

The computer 402 can serve in a role as a client, a network component, a server, a database, a persistency, or components of a computer system for performing the subject matter described in the present disclosure. The illustrated computer 402 is communicably coupled with a network 430. In some implementations, one or more components of the computer 402 can be configured to operate within different environments, including cloud-computing-based environments, local environments, global environments, and combinations of environments.

At a high level, the computer 402 is an electronic computing device operable to receive, transmit, process, store, and manage data and information associated with the described subject matter. According to some implementations, the computer 402 can also include, or be communicably coupled with, an application server, an email server, a web server, a caching server, a streaming data server, or a combination of servers.

The computer 402 can receive requests over network 430 from a client application (for example, executing on another computer 402). The computer 402 can respond to the received requests by processing the received requests using software applications. Requests can also be sent to the computer 402 from internal users (for example, from a command console), external (or third) parties, automated applications, entities, individuals, systems, and computers.

Each of the components of the computer 402 can communicate using a system bus 403. In some implementations, any or all of the components of the computer 402, including hardware or software components, can interface with each other or the interface 404 (or a combination of both), over the system bus 403. Interfaces can use an application programming interface (API) 412, a service layer 413, or a combination of the API 412 and service layer 413. The API 412 can include specifications for routines, data structures, and object classes. The API 412 can be either computer-language independent or dependent. The API 412 can refer to a complete interface, a single function, or a set of APIs.

The service layer 413 can provide software services to the computer 402 and other components (whether illustrated or not) that are communicably coupled to the computer 402. The functionality of the computer 402 can be accessible for all service consumers using this service layer. Software services, such as those provided by the service layer 413, can provide reusable, defined functionalities through a defined interface. For example, the interface can be software written in JAVA, C++, or a language providing data in extensible markup language (XML) format. While illustrated as an integrated component of the computer 402, in alternative implementations, the API 412 or the service layer 413 can be stand-alone components in relation to other components of the computer 402 and other components communicably coupled to the computer 402. Moreover, any or all parts of the API 412 or the service layer 413 can be implemented as child or sub-modules of another software module, enterprise application, or hardware module without departing from the scope of the present disclosure.

The computer 402 includes an interface 404. Although illustrated as a single interface 404 in FIG. 4, two or more interfaces 404 can be used according to particular needs, desires, or particular implementations of the computer 402 and the described functionality. The interface 404 can be used by the computer 402 for communicating with other systems that are connected to the network 430 (whether illustrated or not) in a distributed environment. Generally, the interface 404 can include, or be implemented using, logic encoded in software or hardware (or a combination of software and hardware) operable to communicate with the network 430. More specifically, the interface 404 can include software supporting one or more communication protocols associated with communications. As such, the network 430 or the interface's hardware can be operable to communicate physical signals within and outside of the illustrated computer 402.

The computer 402 includes a processor 405. Although illustrated as a single processor 405 in FIG. 4, two or more processors 405 can be used according to particular needs, desires, or particular implementations of the computer 402 and the described functionality. Generally, the processor 405 can execute instructions and can manipulate data to perform the operations of the computer 402, including operations using algorithms, methods, functions, processes, flows, and procedures as described in the present disclosure.

The computer 402 also includes a database 406 that can hold data for the computer 402 and other components connected to the network 430 (whether illustrated or not). For example, database 406 can be an in-memory, conventional, or a database storing data consistent with the present disclosure. In some implementations, database 406 can be a combination of two or more different database types (for example, hybrid in-memory and conventional databases) according to particular needs, desires, or particular implementations of the computer 402 and the described functionality. Although illustrated as a single database 406 in FIG. 4, two or more databases (of the same, different, or combination of types) can be used according to particular needs, desires, or particular implementations of the computer 402 and the described functionality. While database 406 is illustrated as an internal component of the computer 402, in alternative implementations, database 406 can be external to the computer 402.

The computer 402 also includes a memory 407 that can hold data for the computer 402 or a combination of components connected to the network 430 (whether illustrated or not). Memory 407 can store any data consistent with the present disclosure. In some implementations, memory 407 can be a combination of two or more different types of memory (for example, a combination of semiconductor and magnetic storage) according to particular needs, desires, or particular implementations of the computer 402 and the described functionality. Although illustrated as a single memory 407 in FIG. 4, two or more memories 407 (of the same, different, or combination of types) can be used according to particular needs, desires, or particular implementations of the computer 402 and the described functionality. While memory 407 is illustrated as an internal component of the computer 402, in alternative implementations, memory 407 can be external to the computer 402.

The application 408 can be an algorithmic software engine providing functionality according to particular needs, desires, or particular implementations of the computer 402 and the described functionality. For example, application 408 can serve as one or more components, modules, or applications. Further, although illustrated as a single application 408, the application 408 can be implemented as multiple applications 408 on the computer 402. In addition, although illustrated as internal to the computer 402, in alternative implementations, the application 408 can be external to the computer 402.

The computer 402 can also include a power supply 414. The power supply 414 can include a rechargeable or non-rechargeable battery that can be configured to be either user- or non-user-replaceable. In some implementations, the power supply 414 can include power-conversion and management circuits, including recharging, standby, and power management functionalities. In some implementations, the power-supply 414 can include a power plug to allow the computer 402 to be plugged into a wall socket or a power source to, for example, power the computer 402 or recharge a rechargeable battery.

There can be any number of computers 402 associated with, or external to, a computer system containing computer 402, with each computer 402 communicating over network 430. Further, the terms "client," "user," and other appropriate terminology can be used interchangeably, as appropriate, without departing from the scope of the present disclosure. Moreover, the present disclosure contemplates that many users can use one computer 402 and one user can use multiple computers 402.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal. The example, the signal can be a machine-generated electrical, optical, or electromagnetic signal that is generated to encode information for transmission to suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatus, devices, and machines for processing data, including by way of example, a programmable processor, a computer, or multiple processors or computers. The apparatus can also include special purpose logic circuitry including, for example, a central processing unit (CPU), a field programmable gate array (FPGA), or an application-specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, for example LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as stand-alone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, sub-programs, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory. A computer can also include, or be operatively coupled to, one or more mass storage devices for storing data. In some implementations, a computer can receive data from, and transfer data to, the mass storage devices including, for example, magnetic, magneto-optical disks, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer-readable media (transitory or non-transitory, as appropriate) suitable for storing computer program instructions and data can include all forms of permanent/non-permanent and volatile/non-volatile memory, media, and memory devices. Computer-readable media can include, for example, semiconductor memory devices such as random access memory (RAM), read-only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer-readable media can also include, for example, magnetic devices such as tape, cartridges, cassettes, and internal/removable disks. Computer-readable media can also include magneto-optical disks and optical memory devices and technologies including, for example, digital video disc (DVD), CD-ROM, DVD+/−R, DVD-RAM, DVD-ROM, HD-DVD, and BLU-RAY. The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated in, special purpose logic circuitry.

Implementations of the subject matter described in the present disclosure can be implemented on a computer having a display device for providing interaction with a user, including displaying information to (and receiving input from) the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including to receive user feedback including, for example, sensory feedback including visual feedback, auditory feedback, or tactile feedback. Input from the user can be received in the form of acoustic, speech, or tactile input. In addition, a computer can interact with a user by sending documents to, and receiving documents from, a device that is used by the user. For example, the computer can send web pages to a web browser on a user's client device in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back-end component, for example, as a data server, or that includes a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship.

Cluster file systems can be any file system type accessible from multiple servers for read and update. Locking or consistency tracking may not be necessary since the locking of exchange file system can be done at application layer. Furthermore, Unicode data files can be different from non-Unicode data files.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system comprising a computer memory interoperably coupled with a hardware processor configured to perform the computer-implemented method or the instructions stored on the non-transitory, computer-readable medium.

What is claimed is:

1. An apparatus for printing a three-dimensional object, the apparatus comprising:
    a stage defining a build plane;
    micro light emitting diode (µLED) array comprising multiple pixels and configured to emit ultraviolet (UV) light towards the build plane;
    a two-dimensional voice coil manipulator mechanically coupled to the µLED array and configured to align the pixels of the µLED array with respect to the build plane; and
    an electronic control module in communication with the µLED array and the two-dimensional voice coil manipulator, the electronic control module being programmed to cause the µLED array to illuminate a UV curable material at the build plane to form a stack of layers of the three-dimensional object, wherein the apparatus adjusts a UV illumination pattern for the layers of the UV curable material by varying an output intensity of UV light from the pixels of the µLED array and by varying an alignment between the µLED array and the build plane using the two-dimensional voice coil manipulator.

2. The apparatus of claim 1, wherein each pixel of the µLED array in a plane of the µLED array has a maximum dimension of 10 µm or less.

3. The apparatus of claim 1, wherein the pixels of the µLED array are spaced in a plane of the µLED array with a pixel density of 100 pixels per inch (ppi) or more.

4. The apparatus of claim 1, wherein each pixel of the µLED array comprises a field effect deep UV micro light emitting diode (µLED).

5. The apparatus of claim 4, wherein each field effect deep UV μLED is characterized by a light conversion efficiency that is above 10%.

6. The apparatus of claim 1, wherein the output intensity of the UV light from the μLED array is greater than 100 mW/cm².

7. The apparatus of claim 1, further comprising:
one or more additional μLED array mechanically coupled to a voice coil manipulator assembly housing the μLED array and the two-dimensional voice coil manipulator, wherein the electronic control module is programmed to cause the two-dimensional voice coil manipulator to simultaneously align pixels of each μLED array with respect to the build plane.

8. The apparatus of claim 1, wherein the micro light emitting diode (μLED) array comprises a photomask arranged on a surface of the μLED array and configured to shape the output intensity of the UV light from the μLED array.

9. The apparatus of claim 8, wherein the photomask is digitally displayed and configured to shape the output intensity of UV light from the μLED array such that when a particular pixel is deactivated, light emission is passed from the μLED array to a constituent layer of the UV curable material at the build plane.

10. The apparatus of claim 9, wherein each particular pixel has a dimension that is fixed in a plane of the μLED array when the μLED array is manufactured.

11. The apparatus of claim 9, wherein the pixels in a plane of the μLED array are sized and shaped to be smaller than 10 μm in diameter and under 20 μm in pitch.

12. The apparatus of claim 1, wherein the two-dimensional voice coil manipulator comprises an active prismatic joint and a passive prismatic joint.

13. A method for printing a three-dimensional object, the method comprising:
providing a ultraviolet (UV) curable material at a build plane;
illuminating the UV curable material with a UV light pattern to form a stack of layers of the three-dimensional object, the UV light pattern being emitted by a micro light emitting diode (μLED) array with an output intensity greater than 100 mW/cm², the μLED array comprising multiple pixels; and
aligning the pixels of the μLED array with respect to the build plane by using a two-dimensional voice coil manipulator mechanically coupled to the μLED array, wherein the UV light pattern at the build plane is varied for the layers by adjusting an output intensity of UV light from the pixels and by varying an alignment between the μLED array and the build plane.

14. The method of claim 13, wherein illuminating the UV curable material is preceding by one step of aligning the pixels of the μLED array such that the UV light pattern encompasses a specific layer of the UV curable material on the build plane.

15. The method of claim 13, wherein illuminating the UV curable material comprises operating the pixels of the μLED array with a light conversion efficiency above 10%.

16. The method of claim 13, wherein:
illuminating the UV curable material comprises operating one or more additional μLED array mechanically coupled to a voice coil manipulator assembly housing the μLED array and the two-dimensional voice coil manipulator, each additional μLED array comprising multiple pixels.

17. The method of claim 16, further comprising:
simultaneously aligning the pixels of the μLED array and the one or more additional μLED array with respect to the build plane by using the two-dimensional voice coil manipulator mechanically coupled to each μLED array.

18. The method of claim 13, wherein aligning the pixels of the μLED array comprises:
operating the two-dimensional voice coil manipulator to distribute UV light emitted from the μLED array to achieve the UV light pattern on each constituent layer of the stack of layers of the three-dimensional object.

19. The method of claim 18, wherein operating the two-dimensional voice coil manipulator comprises:
asserting a prismatic control to distribute UV light emitted from the μLED array.

20. The method of claim 18, wherein operating the two-dimensional voice coil manipulator comprises:
asserting a revolute control to distribute UV light emitted from the μLED array.

* * * * *